United States Patent
Arkin

(10) Patent No.: US 7,893,701 B2
(45) Date of Patent: Feb. 22, 2011

(54) METHOD AND APPARATUS FOR ENHANCED PROBE CARD ARCHITECTURE

(75) Inventor: Brian Arkin, Pleasanton, UT (US)

(73) Assignee: FormFactor, Inc., Livermore, CA (US)

( * ) Notice: Subject to any disclaimer, the term of this patent is extended or adjusted under 35 U.S.C. 154(b) by 107 days.

(21) Appl. No.: 12/432,039

(22) Filed: Apr. 29, 2009

(65) Prior Publication Data

US 2009/0273358 A1 Nov. 5, 2009

Related U.S. Application Data

(60) Provisional application No. 61/050,503, filed on May 5, 2008.

(51) Int. Cl.
*G01R 31/02* (2006.01)
(52) U.S. Cl. ............... 324/754; 324/158.1; 324/765
(58) Field of Classification Search ........... 324/73.1, 324/158.1, 750–755, 760–765; 438/14–18; 714/743, 738, 724, 715; 702/117, 118
See application file for complete search history.

(56) References Cited

U.S. PATENT DOCUMENTS

| | | | |
|---|---|---|---|
| 5,363,038 A | 11/1994 | Love | |
| 5,600,257 A | 2/1997 | Leas | |
| 6,275,051 B1 | 8/2001 | Bachelder | |
| 6,400,173 B1 | 6/2002 | Shimizu | |
| 7,523,373 B2 * | 4/2009 | Russell et al. | 714/745 |
| 7,723,979 B2 * | 5/2010 | Ashburn et al. | 324/142 |
| 2006/0273809 A1 | 12/2006 | Miller | |

OTHER PUBLICATIONS

U.S. Appl. No. 12/168,045, filed Jul. 3, 2008, Henson.

* cited by examiner

*Primary Examiner*—Minh N Tang
*Assistant Examiner*—Trung Q Nguyen
(74) *Attorney, Agent, or Firm*—Kirton & McConkie

(57) ABSTRACT

A technique for distributing power to a plurality of dies uses a probe card. The probe card can include a plurality of regulators, each regulator accepting a bulk power input and producing a regulated output. The regulated output can be controlled by a programmable controller that accepts a tester-controlled power input and adjusts the regulated outputs as a function of the tester-controlled power input.

29 Claims, 12 Drawing Sheets

METHOD AND APPARATUS FOR ENHANCED PROBE CARD ARCHITECTURE

CROSS REFERENCE TO RELATED APPLICATIONS

This application claims the benefit of Provisional Patent Application Ser. No. 61/050,503, filed on May 5, 2008, entitled "Method and Apparatus for Enhanced Probe Card Architecture" which is hereby incorporated by reference in its entirety.

BACKGROUND

Semiconductor dies are typically manufactured on a semiconductor wafer. A wafer may have many (e.g., hundreds) dies. Testing of the dies is typically performed to allow defective dies to be identified. To perform testing of the dies, the dies are typically placed into a tester. Electrical connection to the dies is typically provided by a probe card assembly. The probe card assembly includes probes, which can be brought into contact with bond pads and/or other terminals on the semiconductor dies to form temporary electrical connections between the tester and the dies. The tester can apply power and test data inputs to the dies, and monitor data outputs from the dies to determine if the dies are operating correctly.

Testing large numbers of dies in parallel is desirable, since this can reduce the test time and increase tester throughput. As wafers have become larger, the number of dies on a single wafer can exceed the available resources of a tester. Various techniques have been developed for sharing data inputs and outputs from multiple dies on a single tester channel allowing for some increase in parallel test capacity.

Powering large numbers of dies can prove to be difficult, however. In some situations, the amount of power the tester can provide may be insufficient to power a desired number of dies. Some die designs use lower power voltages, which can result in decreased power efficiency of the tester when linear regulators are used in the tester. Some die designs use an increased number of different power voltages. Some die designs require the power voltage to change when operating in different modes. These issues present obstacles to powering and testing large numbers of dies in parallel.

SUMMARY

In some embodiments, a probe card assembly can include a support structure and a plurality of probes coupled to the support structure. The probe card assembly can include a tester electrical interface for connecting to a tester, and a bulk power input for accepting bulk power. A plurality of regulators can be disposed on the probe card, each configured to produce a regulated output from the bulk power. A programmable controller can accept a tester-controlled power input from the tester electrical interface and control ones of the regulated outputs of the regulators as a function of the tester-controlled power input.

In some embodiments, a probe card assembly can include a plurality of probes, and a means for distributing a plurality of regulated power outputs to ones of the plurality of probes. Disposed on the probe card assembly can be means for generating the plurality of regulated power outputs from a bulk power input. The probe card assembly can also include means for controlling voltage and/or current of ones of the regulated power outputs as a function of a tester-controlled power input.

In some embodiments, a method of distributing power to a plurality of dies can use probe contacts of a probe card assembly installed in a tester. The method can include providing bulk power and a tester-controlled power input to the probe card. The method can also include generating a plurality of regulated power outputs from the bulk power, and controlling the voltage and/or current of ones of the plurality of regulated power outputs. The voltage and/or current can be a programmable function of the tester-controlled power input. The method can also include distributing the plurality of regulated power outputs to ones of the plurality of probe contacts.

DETAILED DESCRIPTION OF EXEMPLARY EMBODIMENTS

Figure 1:
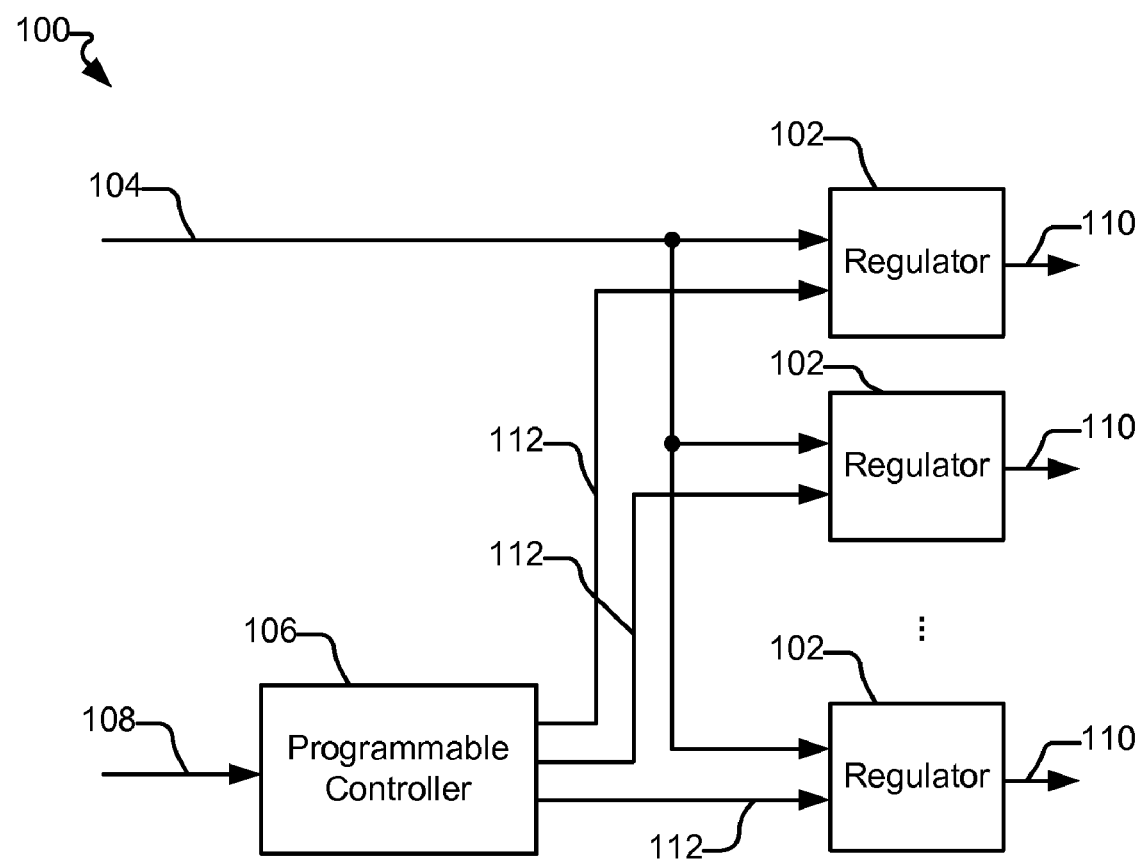
FIG. 1 shows a block diagram of an electrical circuit that can be used on a probe card assembly according to some embodiments of the invention.

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on" and "attached to" are used herein, one object (e.g., a material, a layer, a substrate, etc.) can be "on" or "attached to" another object regardless of whether the one object is directly on or attached to the other object or there are one or more intervening objects between the one object and the other object. Also, directions (e.g., above, below, top, bottom, side, up, down, under, over, upper, lower, horizontal, vertical, "x,"

"y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

In some embodiments of the invention, power management during testing of a die or dies that use multiple power supplies can be improved. For example, a tester often includes a test program to control data signals and power provided to a device being tested and to analyze response signals generated by the device. A tester and test program designed for testing a first number (N) of dies can be used to test more than the first number (N) (e.g., 2×N) dies by providing multiple regulated supplies on the probe card assembly that contacts the device. A power output from the tester can be used as a control function (rather than raw power) to indirectly control the multiple regulated power supplies. In such a manner, it may be possible to provide increased parallelism in testing without requiring changes to the tester hardware or test program. Moreover, the control function can use processing capability included on the probe card assembly to allow translation between the power output from the tester used as a control function to provide different voltages, currents, or time behavior to allow an existing tester and test program to be used to test dies having differing power requirements than that accommodated by the tester and test program alone.

Accordingly, in some embodiments of the invention, a probe card assembly can include a number of regulators and a programmable controller, wherein the regulators are controlled by the programmable controller. For example, the programmable controller can accept a test channel input from the tester and control the outputs of the regulators according to a function of the test channel input. Various functions can be implemented in the programmable controller, including for example, adding and subtracting offsets, ramping voltages up and down, averaging the test channel input, and the like. Various ways of providing input power to the regulators can be used, including for example providing power from an external supply, using available test head power, or programming a test channel for efficient power delivery.

FIG. 1 illustrates a block diagram of a circuit 100 that can be used on a probe card assembly in accordance with some embodiments of the present invention. Mechanical portions of the probe card assembly are not illustrated in FIG. 1, but can be as described further below in conjunction with FIGS. 7 and 8. For example, the circuit 100 can be disposed on the wiring substrate 810 or probe head 814 of the probe card assembly 806 illustrated in FIG. 8.

Referring to FIG. 1, the circuit 100 can include a plurality of regulators 102. The regulators 102 can accept a bulk power input 104 which is regulated by the regulators 102 to form regulated outputs 110. The regulators can be, for example, switching power supplies (e.g., a DC-to-DC converter). The bulk power input 104 can be, for example, provided by a tester or by an external power supply as discussed further below (e.g., through connectors to a tester). The regulated outputs 110 can be, for example, provided to probes on a probe card as discussed further below. A programmable controller 106 can be coupled to control inputs 112 of the regulators 102 to allow the programmable controller 106 to control the regulated outputs 110.

The programmable controller 106 can accept a tester-controlled power input 108. The programmable controller 106 can use the tester-controlled power input 108 as an input to a control function. For example, voltage, current, or both of the regulated outputs 110 can be determined by the programmable controller 106 as a function of the tester-controlled power input 108. In other words, the voltage, current, or both of the regulated outputs can take on values that are determined by the tester-controlled power input 108, for example, according to a mathematical function. Individual ones of the regulators 102 can be controlled using the same or different functions. In other words, if desired, each regulator 102 can be controlled with the same function of the tester-controlled power input 108, in which case the regulated outputs 110 will be generally similar. Alternatively, some of the regulators 102 can be controlled using a different function of the programmable controller 106 than others of the regulators 102, in which case the regulated outputs 110 can be different. For example, first ones of the regulators can be controlled using a first function, and second ones of the regulators can be controlled using a second function. The circuit 100 can also include additional regulators (not shown) which are not coupled to the programmable controller.

In some embodiments, the circuit 100 can be used to provide increased power fanout for a tester. For example, the programmable controller 106 can be used to cause the regulated outputs 110 to track an input voltage of the tester-controlled power input 108. This can, for example, allow increased numbers of dies to be tested without requiring changes to the test program of a tester using the probe card assembly.

In some embodiments, the circuit 100 can be used to provide additional voltages to a device under test that are not available directly from the tester. For example, a test program executing on the tester may be designed to operate with a first die design that use ones or more first voltages. The test program may vary one or more outputs 110 according to the one or more first voltages. A second die design may use one or more second voltages that are different from the one or more first voltages, yet otherwise provide the same functionality as the older die design. The test program can therefore be reused to test the second die, using the programmable controller 106 to cause the cause the regulated outputs 110 to output the one or more second voltages based on the one or more first voltages being provided at the tester-controlled power input 108. The regulated outputs 110 can therefore be set to the one or more first voltages, the one or more second voltages, or some regulated outputs sets to some first voltages and some test outputs set to second voltages.

The programmable controller 106 can be a microcontroller, including for example an ARM microcontroller or other type of digital, electronic controller. Included on or associated with the microcontroller can be program memory, executable instructions stored or loaded into the program data memory, data memory, and input/output interfaces or busses. Executable instructions can cause the microcontroller to perform processes, such as for example, controlling the regulators 102. The programmable controller can be programmed to perform mathematical calculations, including for example, adding or subtracting a value, multiplying a value, averaging, or more complex signal processing operations.

Figure 9:
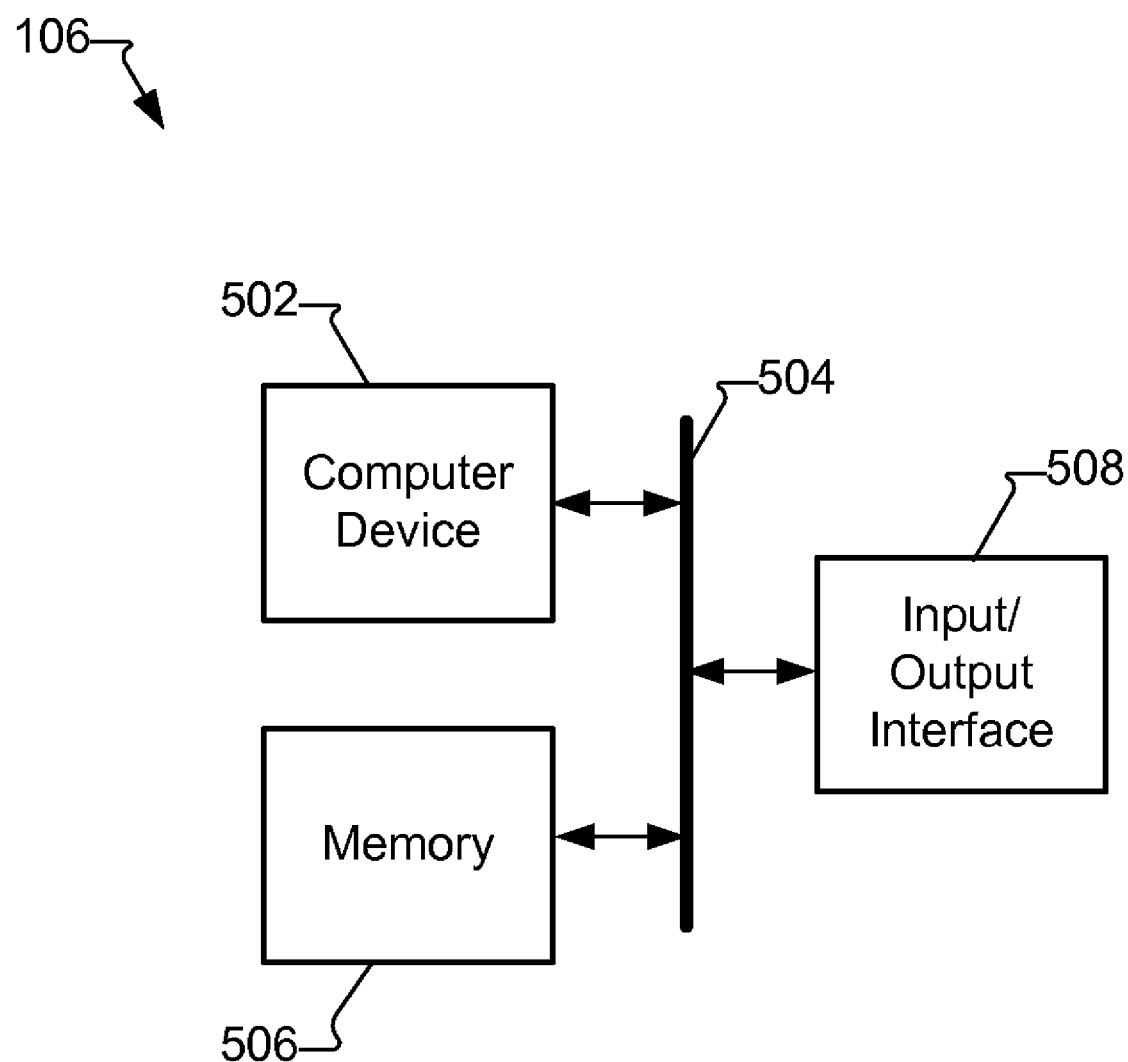
FIG. 9 illustrates an electrical block diagram of a programmable controller in accordance with some embodiments of the present invention.

For example, FIG. 9 illustrates an electrical block diagram of an example of a configuration of the programmable controller 106 in accordance with some embodiments of the present invention. As shown in FIG. 9, the programmable controller 106 can include a computer device 502, which can be a general-purpose or special-purpose processor (e.g., a digital signal processor) or multiple processors. The programmable controller 106 can include a bus 504 which can be configured to connect various components thereof and can also enable data to be exchanged between two or more components. The bus 504 can be any of a variety of bus structures such as, for example, a memory bus or memory controller, a peripheral bus, or a local bus that uses any of a variety of bus architectures. As shown in FIG. 9, the bus 504 can interface the computing device 502 to a memory 506, which can be for example an instruction memory, data memory, mass storage memory, or the like. The bus 504 can also interface to the computing device 502 to an input/output interface 508 and/or other components (not shown). The input/output interface 508 can provide for exchange of data between the computing device 502 and other system components (not shown), including for example, analog to digital converters, other computing devices, hardware components, and the like.

The computing device 502 can execute instructions stored in the memory 506. Such instructions can include data structures, objects, programs, routines, or other program modules that can be accessed by and that cause the computing device 502 to perform a particular function or group of functions and are examples of program code means for implementing methods disclosed herein.

The programmable controller 106 can alternatively be implemented in hardware, such as digital logic circuitry. For example, the programmable controller 106 can be implemented in digital hardware as a state machine. In general, a state machine can include memory to store an internal state and can accept one or more inputs which cause the internal states of the state machine to change and/or cause an output to occur. A state machine can be implemented in digital hardware using a programmable logic device, a programmable logic controller, logic gates and/or flip flops. For example, a storage register can be used to store current state information, combinatorial logic can be used to determine new state information as a function of inputs and current state information, and combinatorial logic can be used to determine outputs. State machines can be implemented using synchronous techniques (e.g., using a free running clock) or asynchronous techniques (e.g., wherein state transitions occur as a result of input changes).

Figure 2:
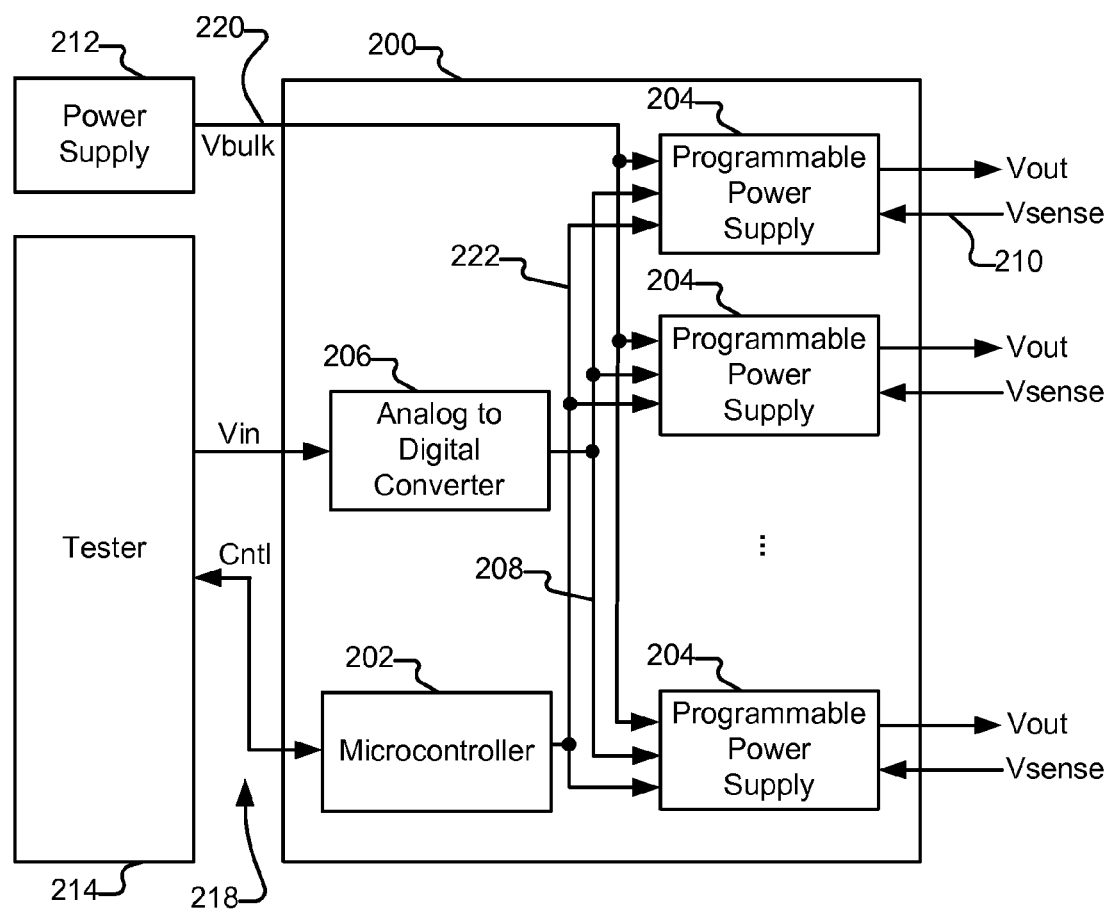
FIG. 2 shows a block diagram of another electrical circuit arrangement that can be used on a probe card assembly in accordance with some embodiments of the invention.

FIG. 2 illustrates an alternate arrangement of a circuit 200 that can be used on a probe card assembly in accordance with some embodiments of the present invention (mechanical aspects of the probe card assembly, such as probes, circuit boards, traces, etc. are not shown). The circuit 200 can be coupled to a tester 214 via an electrical interface 218 and can be coupled to a power supply 212 via a bulk power input 220. The circuit 200 can include multiple programmable power supplies 204 in communication with a microcontroller 202. A power input (Vin) from the tester 214 can be sampled by an analog to digital converter 206 to form a digital control value 208. The digital control value 208 can be provided to the programmable power supplies 204. The microcontroller 202 can be used to control the operation of the programmable power supplies 204 via interface 222. The microcontroller 202 can include a control interface (Cntl) to the tester 214 for communication between the microcontroller 202 and the tester 214. The microcontroller 202 can be like programmable controller 106.

The programmable power supplies 204 can include various capabilities. For example, the programmable power supplies can include DC-DC converters, which can enable efficient conversion of the bulk input power (Vbulk) into power (Vout) provided to the devices under test. For example, voltage conversion on the probe card assembling using the DC-DC converters can be used in place of (typically) linear regulators in the tester, helping to provide higher power availability to the device under test and lower wasted power. The programmable power supplies 204 can include output current limiting to help avoid damage when connected to a defective device under test. The programmable power supplies 204 can also include remote sensing (using sense outputs Vsense 210) of voltage at the devices under test to improve regulation. Other features can include under voltage lockout, ganging capability, power up and power down modes, and the like. Control of programmable power supply 204 features can be provided by microcontroller 202, for example, by writing control registers internally in the programmable power supplies 204 to define values such as current limit, voltage limit, etc. through interface 222. The microcontroller 202 can, for example, set each programmable power supply 204 into different operating modes via interface 222. For example, the microcontroller 202 can be configured to autonomously set up the programmable power supplies 204 to preprogrammed configurations (output voltage, current trip and limit values, etc.). In other words, the microcontroller 202 can be configured to perform various actions without requiring intervention from the tester 214 based on programming stored in internal microcontroller memory or other memory on the probe card assembly.

The digital control value 208 can be used by the programmable power supplies 204 in various ways. For example, the microcontroller 202 can set the programmable power supplies 204 into a voltage follower mode, so that the output voltage (Vout) from the supplies follows the digital control value. As another example, the programmable power supplies 204 can be set into a mode where they are enabled or disabled based on the digital control value 208. The programmable power supplies can thus produce regulated output voltage (Vout) from bulk power (Vbulk) 220 having voltages controlled by the digital control value 208 and the microcontroller 202.

The bulk power (Vbulk) 220 can be provided by a power supply 212 separate from the tester 214. Such a configuration can, for example, be helpful when the tester 214 provides less power capability than desired. The interface to the power supply 212 can be provided by a separate connector from the electrical interface 218 to the tester 214. Alternately, bulk power can be provided by the tester through the electrical interface 218 as described further below in conjunction with FIG. 3.

The electrical interface 218 to the tester 214 can also include a control interface (Cntl) between the tester and the microcontroller 202. The control interface can be used to communicate information between the microcontroller 202 and the tester 214, including for example, test commands, configuration information, status information, and/or test results. The control interface can be provided, for example, by one or more test channels of the tester 214.

Figure 3:
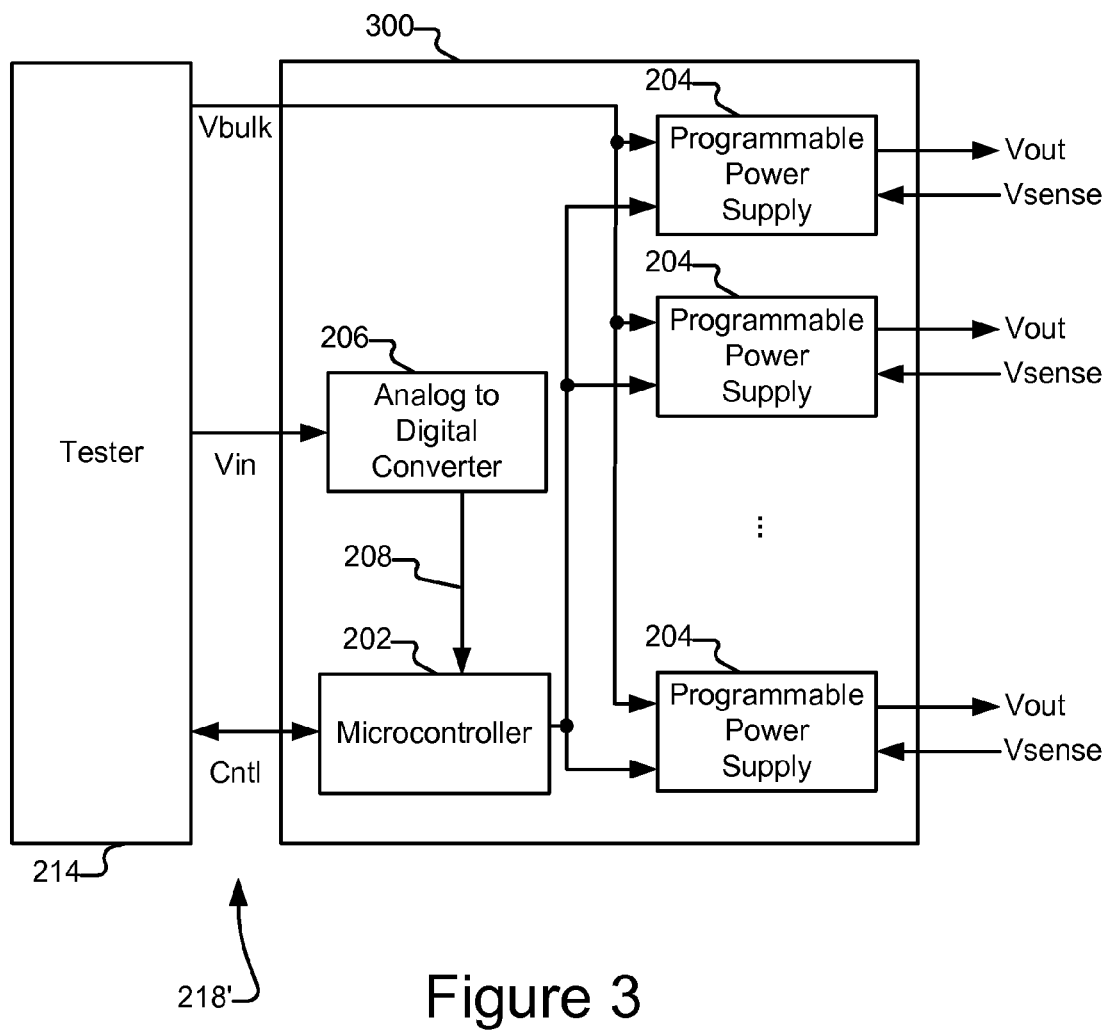
FIG. 3 shows a block diagram of another arrangement of an electrical circuit than can be used on a probe card assembly in accordance with some embodiments of the invention.

FIG. 3 illustrates an alternate arrangement of a circuit 300 that can be used on a probe card assembly in accordance with some embodiments of the present invention. The circuit 300 can include the same or similar components as the probe card assembly 200 of FIG. 2. The circuit 300 can be coupled to a tester 214 via an electrical interface 218'.

In contrast to the circuit 200 of FIG. 2, the circuit 300 of FIG. 3 can accept bulk power (Vbulk) from the tester 214 via the electrical interface 218'. For example, the bulk power can be provided by test head power available at the test head (not shown) of the tester 214. Test head power is typically power provided by a tester, but not controlled by the tester as a part of the test program. That is, the test head power can be a fixed voltage level (regulated or unregulated). As another example, the bulk power can be provided by a tester channel. For example, a tester channel can be a tester power output channel. The voltage output of the tester power output channel may be programmable, for example, under control of the test program. The tester power output channel can be set (programmed) to output a voltage that provides maximized power efficiency.

For example, many tester power output channels are current limited regardless of the output voltage, and thus provide less output power at lower output voltages. Moreover, some testers use linear regulators for the tester power output channels, and thus at lower voltages, operate less efficiently, increasing the power consumption and heat generation of the tester. Accordingly, the tester power output channel can be set to a voltage that provides maximum power efficiency (e.g., for a fixed current capability supply, setting the output voltage to a maximum value). For example, a tester capable of providing 1 Amp maximum output current on a tester power output channel can provide 5 W of power output at 5 Volts. If the tester power output channel is set to 1.8 V, however, only 1.8 W of power can be provided. In contrast, by keeping the tester power output channel at 5 W, and converting the voltage to 1.8V in an efficient DC-DC converter in the programmable power supply 204, increased power is available to be supplied to the dies under test. As another example, if the tester power output channel can be set to a higher voltage, such as for example, 5.5 V, 7V, or 10V, the available output power is actually increased, allowing for an even greater number of dies to be powered.

As an illustration, one tester channel can be used as the bulk power input to the circuit 300, and set to a voltage that maximizes the available power output. Another tester channel can be used as the tester-controlled power input to the circuit 300, and thus used to control the voltage actually provided to the dies under test. The bulk power can be at a different voltage (Vbulk) than the voltage (Vout) provided to the dies under test because the programmable power supplies 204 can provide a voltage conversion function. This can allow the tester 214 to power more dies, since the tester can be operated in a more efficient mode.

As shown in FIG. 3, the analog to digital converter 206 can provide digital control value 208 to the microcontroller 202, rather than directly to the programmable power supplies 204 as illustrated in FIG. 2. The microcontroller can be used to perform various functions to calculate and control the output voltage (Vout) of the programmable power supplies 204. For example, the microcontroller can control the programmable power supplies 204 to cause the output voltages (Vout) to follow the tester controller power input (Vin) supplied to the analog to digital converter 206. Such a mode of operation can be helpful, for example, for power supply fan out, to provide more output voltages that the tester alone is able to supply.

As another example, the microcontroller can set some outputs (Vout) to a first voltage (e.g., 1.8 V) while other outputs (Vout) are set to a second voltage (e.g., 1.6), while simultaneously causing the outputs (Vout) to track the input (Vin) voltage in a proportional manner. Such a mode of operation can be helpful, for example, when some dies require different voltages than other dies for which the test program was originally designed.

As another example, the control interface can be used to cause the microcontroller 202 to vary some of the regulated outputs during a test cycle based on the state of tester channels provided as inputs from the test to the probe card assembly. For example, some dies under test use different voltages in different operating modes (e.g., lower voltages in standby modes and higher voltages in operating modes). Accordingly, this mode of operation can be helpful in such a situation, where the test cycle includes changing the mode of operation of the die under test that involves changing the voltages during the test cycle.

As another example, the microcontroller 202 can perform functions using control value 208 to determine the regulated output values. Functions can include averaging the control value (e.g., to reduce noise present at the input 214), converting a step input to a ramp, and similar operations. The microcontroller can perform both linear functions (e.g., scaling) and non-linear functions (e.g., limiting). Different programmable power supplies 204 can be controlled using different functions. For example, some voltages can be ramped up and down while other voltages are held constant.

As yet another example, the microcontroller 202 can be used to provide a series of digital voltage values to the programmable power supplies 204 to create a desired ramp, steps, or other desired waveform. A complex waveform can be generated in such a manner, allowing a programmable power supply 204 to act as an arbitrary waveform generator under control of the microcontroller 202.

The microcontroller 202 can also be used to provide autonomous power on initialization and operation. For example, the microcontroller can sequence power up of the programmable power supplies 204 in a desired order without waiting for commands form the tester 214. This can be helpful, for example, when newer dies require more complex power sequencing or multiple voltages not provided by the tester program, and modification of the tester program is desired to be avoided.

Figure 10:
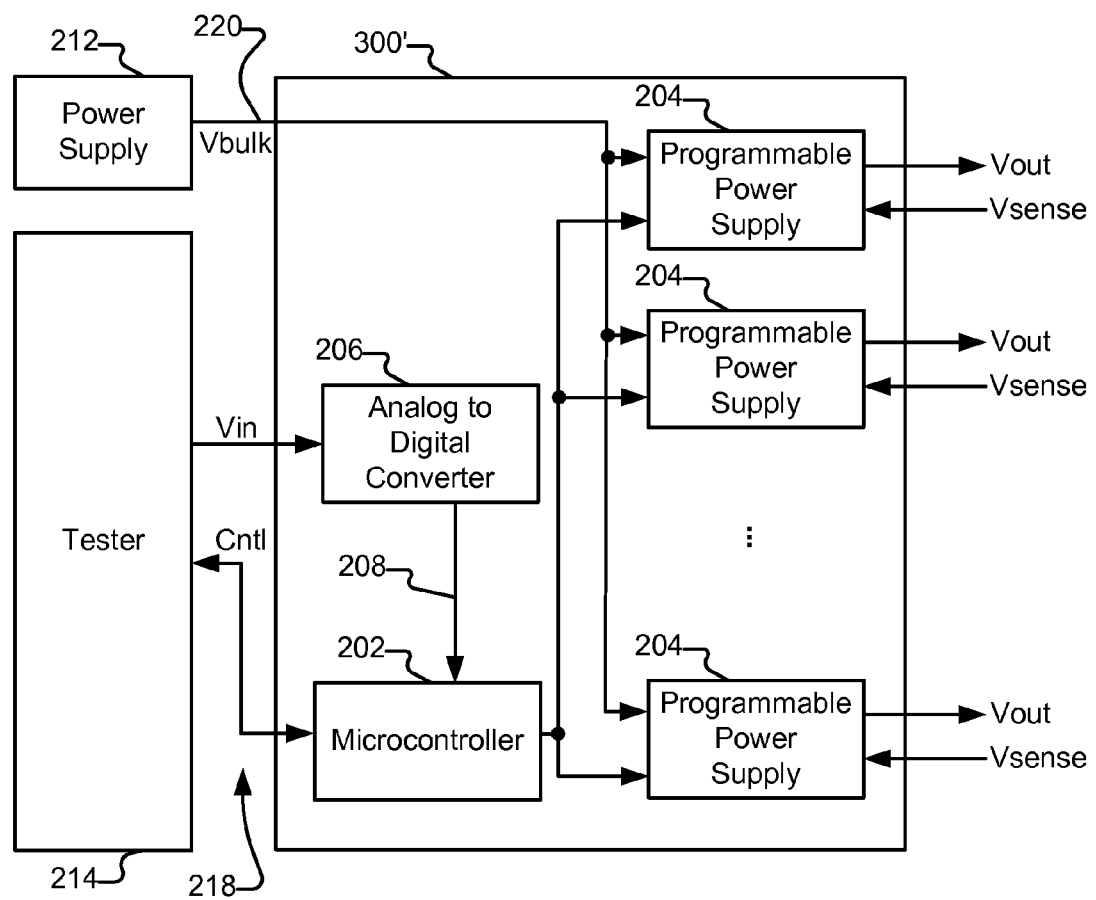
FIG. 10 shows another arrangement of an electrical circuit than can be used on a probe card assembly in accordance with some embodiments of the invention.
Figure 11:
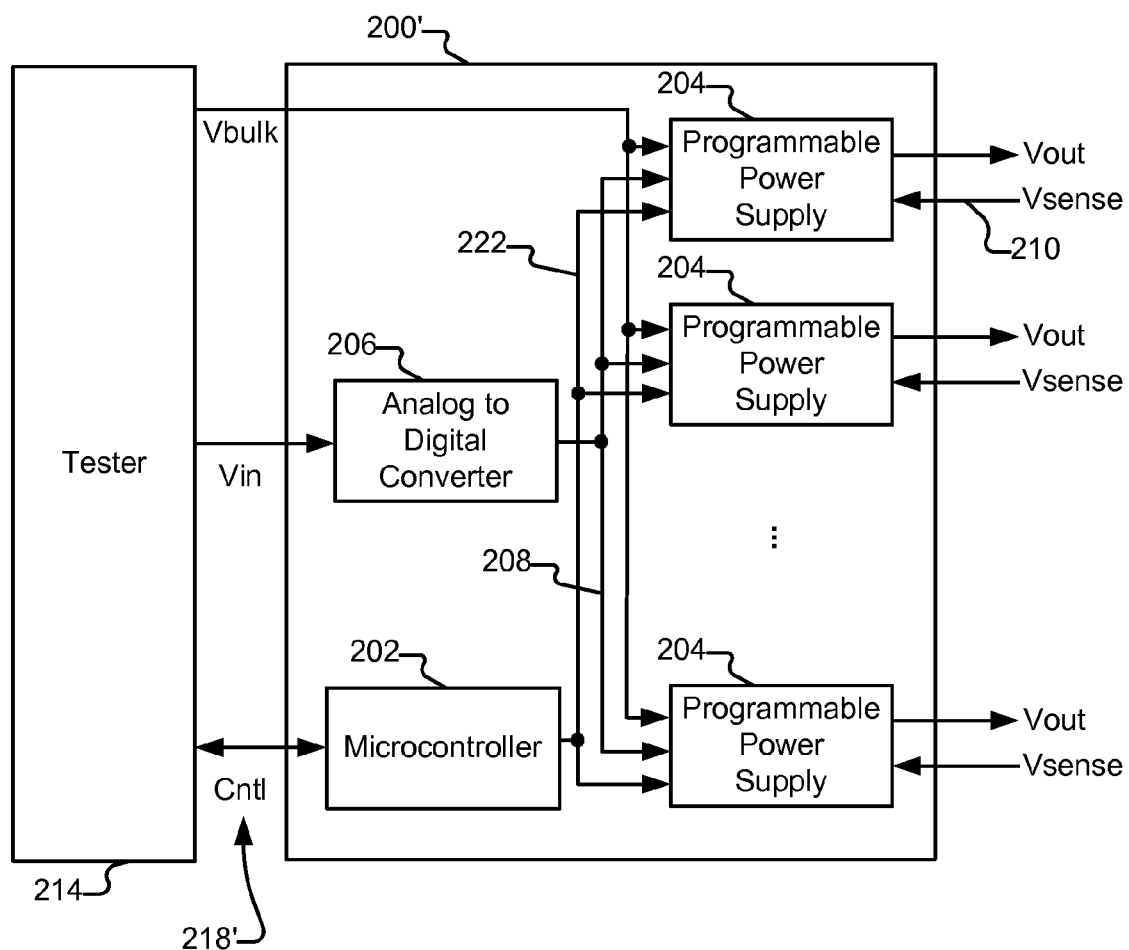
FIG. 11 shows another arrangement of an electrical circuit than can be used on a probe card assembly in accordance with some embodiments of the invention.
Figure 12:
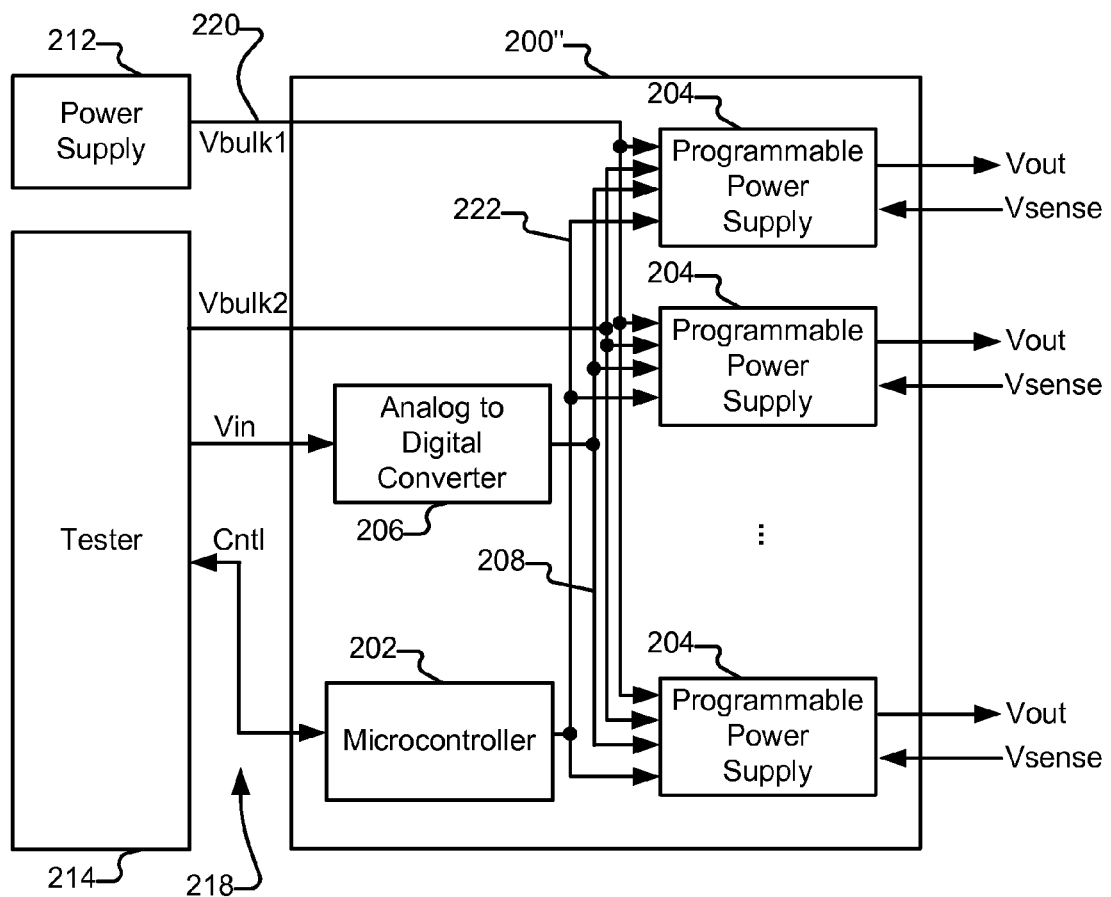
FIG. 12 shows another arrangement of an electrical circuit than can be used on a probe card assembly in accordance with some embodiments of the invention.

It should be noted that various features of FIG. 2 and FIG. 3 can be combined in different arrangements. For example, as shown in FIG. 10, a probe card circuit 300' can include a bulk power input from a separate power supply 212 as in FIG. 2, but include a connection from an analog to digital converter 206 to a microcontroller 202 as shown in FIG. 3. As another example, as shown in FIG. 11, a probe card circuit 200' can accept bulk power from a tester 214 as shown in FIG. 3, but provide a connection from an analog to digital converter 206 to the programmable power supplies 204 as shown in FIG. 2. As yet another example, as shown in FIG. 12, a probe card circuit 200" can provide interfaces (e.g., connectors) allowing bulk power to be accepted from both a separate power supply (Vbulk1) and a tester (Vbulk2). Power can be used selectively from the tester, the separate power supply, or both, selected for example, using switches (not shown) or other components disposed on the probe card circuit 200" or within the individual programmable power supplies 204.

Figure 4:
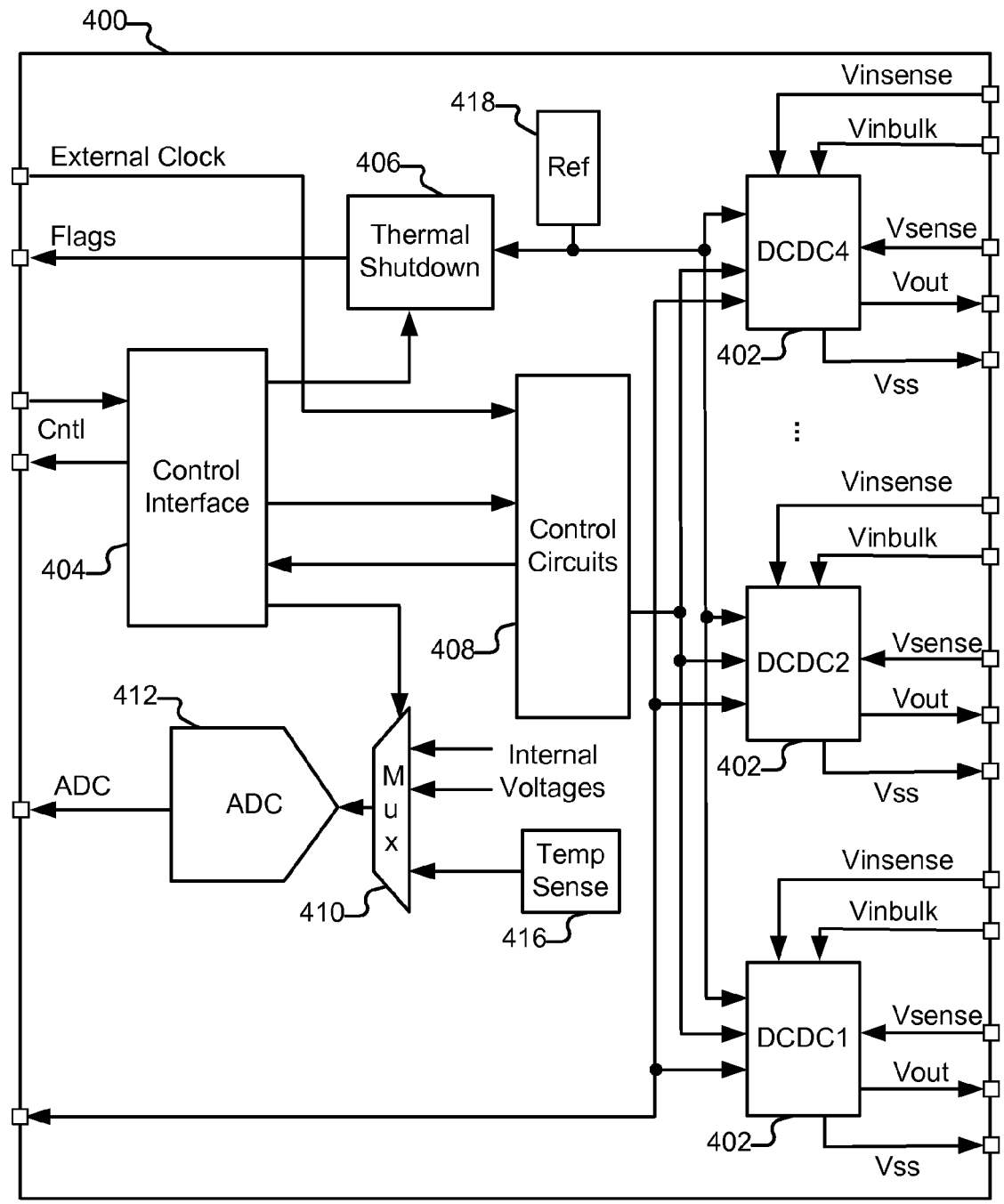
FIG. 4 illustrates a block diagram of a chip that can be included in probe card circuitry of FIGS. 2-3 in accordance with some embodiments of the invention.

FIG. 4 illustrates a block diagram of a chip 400 that can be included in a probe card circuit (e.g., probe card circuits 100, 200, 200', 200", 300, 300') in accordance with some embodiments of the invention. The chip 400 can include a plurality of DC-DC converters 402. Although three DC-DC converters are shown, the number of DC-DC converters is not limited to three, and can be more or less than three. The DC-DC converters 402 can be controlled via control circuits 408 through a control interface 404. The control circuits 408 can, for example, include a programmable controller like microcontroller 202. The control interface 404 can be connected, for example, to a tester or other programming interface. The control interface can also provide control and status for internal chip components, including thermal shutdown circuitry 406, control circuits 408, and multiplexer 410.

Various ways of implementing the control interface 404 can be used. For example, test channels can be used to implement the control interface, providing for basic semaphore (flag) passing between the tester and the chip 400. One or more test channels can be connected to the control interface 404 via Cntl lines. As another example, the control interface 404 can be implemented as a databus, wherein registers of the control interface 404 on the chip 400 can be directly written or read via the Cntl lines.

The chip 400 can include an analog to digital converter 412. The analog to digital converter 412 can be used to check various internal voltages on the chip during tester, for example by using the control interface with the tester. Different internal voltages can be selected by using multiplexer 410. For example, internal voltages can monitored for self test, or can be monitored during testing to affect operation of the chip 400.

Other components included on the chip 400 can include a voltage reference 418, for use by the DC-DC converters 402, and a temperature sensor 416.

Figure 5:
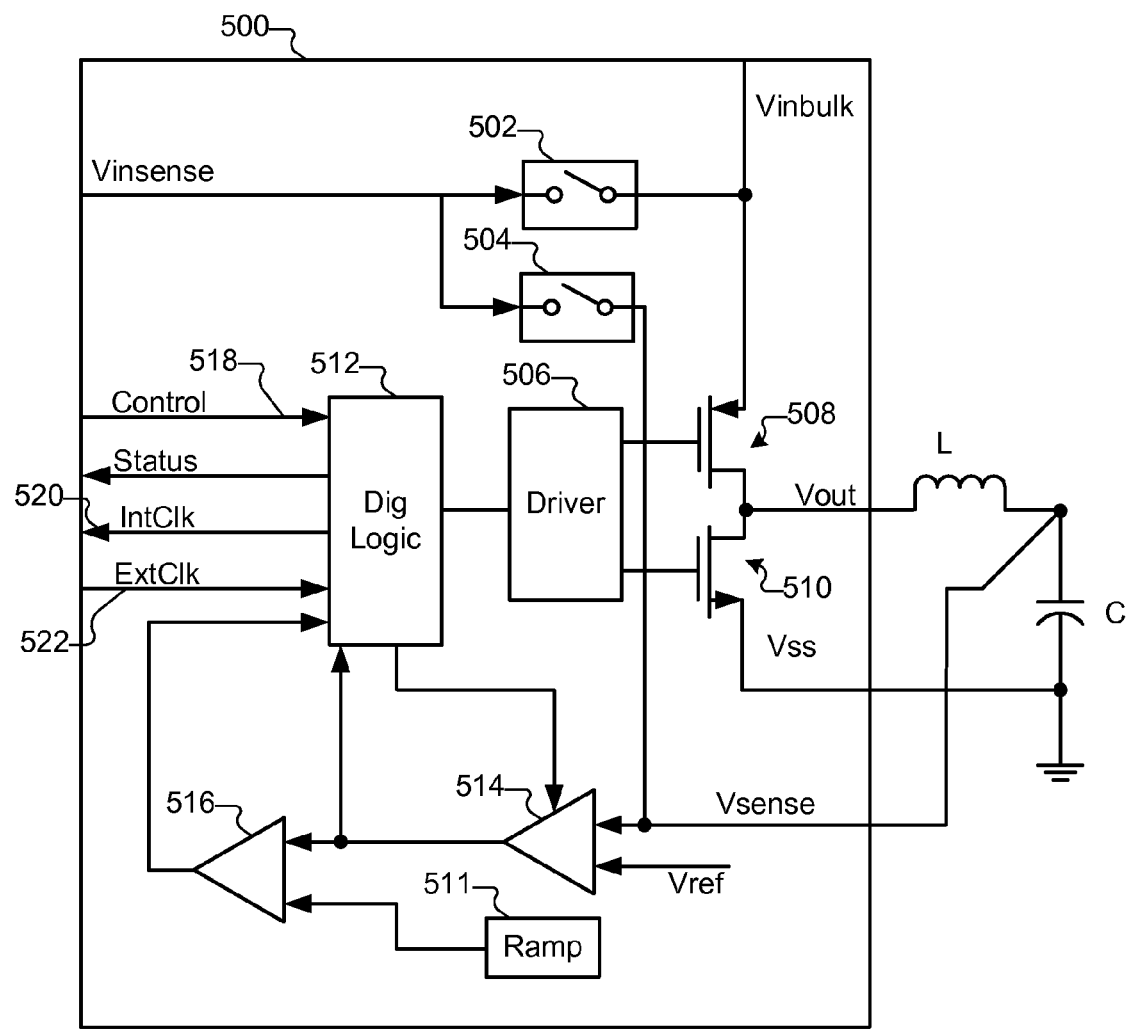
FIG. 5 illustrates a detailed block diagram of a DC-DC converter that can be used in the chip of FIG. 4 in accordance with some embodiments of the invention.

One exemplary embodiment of the DC-DC converters will be discussed in further detail with reference to FIG. 5, which illustrates a detailed block diagram of one embodiment of a DC-DC converter 500 that can be used as for DCDC converters 402 in chip 400 of FIG. 4 in accordance with some embodiments of the present invention, although the chip is not limited to the example DC-DC converter 500 of FIG. 5. The DC-DC converter 500 can be operable in various different modes, set by the control interface 518. The DC-DC converter can operate in a first mode (supplying regulated outputs) by closing switch 502, in which case the converter is regulating and delivering Vout to a load (represented by capacitance C, e.g. a device under test) through connections (represented by inductance L, e.g., traces and probes of a probe card assembly on which the DC-DC converter is used). Driver 506 drives switching transistors 508, 510 to produce the regulated output Vout. The sensed voltage (Vsense) is compared to a reference voltage (Vref) to determine a voltage error. Using ramp generator 511, a second comparator 516 produces pulse width modulation to drive the digital logic 512 which determines the switching control. Driver 506 drives the switching transistors 508, 510. The DC-DC converter can use an internally generated clock 520 (which can be also be output for debugging or other purposes) or an external clock 522 which is provided as an input. The clock can be used to control internal operation of the switching control. The clock can be a normal clock or a clock which has spread-spectrum dithering. Spread-spectrum dithering can be helpful in reducing noise caused by the clock.

The DC-DC converter 500 can be operated in a second mode (ganged operation) of operation, where more than one DC-DC converter is used to supply output current to the same probe or group of probes. In the second mode of operation, the converter operates as either a master or a slave. The slave converters use the control information from the master converter. The output voltage and current limit are also taken from the master converter. The control signals 518 are daisy-chained from the master controller to the slave controllers when operating in a ganged mode.

The DC-DC converter 500 can be placed into a third mode (bypass where no regulation is performed) by closing switch 504 to connect the Vinsense to the Vsense. This can be useful, for example, to allow the tester to make measurements of characteristics of the device under test. For example, by bypassing the DC-DC converter, tester channels are connected to the device under test, allowing measurement of, for example, resistance etc. of the device under test.

Other modes of operation for the DC-DC converter 500 include power up and power down. In power up mode, the DC-DC converter can charge the output capacitance C at a predefined rate until the output crosses a programmed value (e.g. stored in internal registers of the DC-DC converter through the control interface), at which point regulated outputs can be provided. Conversely, in power down mode, the output can be discharged, and then the switches 502, 504 opened to place the DC-DC converter into a high impedance state.

Figure 6:
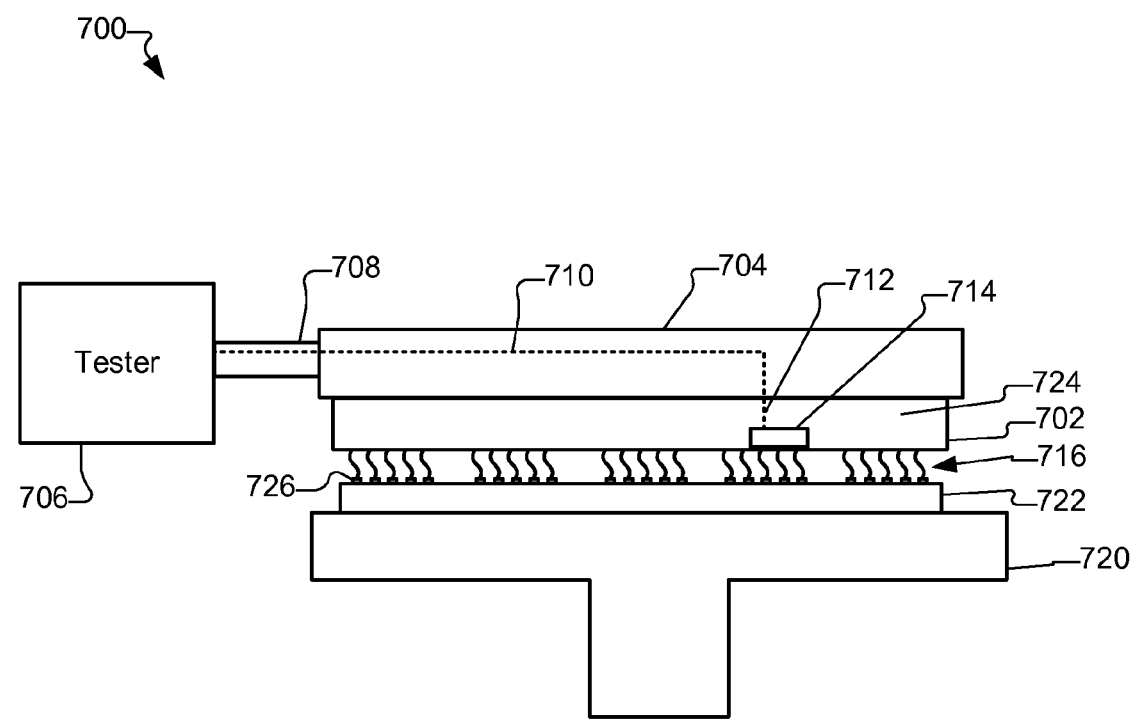
FIG. 6 illustrates a test system in which a probe card assembly can be used in accordance with some embodiments of the invention.

Referring to FIG. 6, a test system 700 is shown in which a probe card assembly 702 can be used. The probe card assembly can include a circuit like any of probe card circuits 100, 200, 200', 200", 300 and 300' discussed above. The probe card assembly 702 can provide an interface between a tester 706 and a device under test 722. The probe card assembly 702 can be installed into the test system 700, for example, by coupling the probe card assembly 702 to a test head 704 or head plate (not shown) of the test system 700. The probe card assembly 700 can be electrically connected to the tester 706, for example through connectors (not shown) and cables 708 (e.g., flexible cables, coaxial cables, etc.). Test signals can be provided from the tester 706 via cables 708 and internal electrical paths 710 in the test head and onto the probe card assembly 702. The probe card can include internal wiring 712 and circuitry 714. For example, the probe card can include a printed circuit board with printed wiring traces onto which the probe card circuitry (e.g., 100, 200, 200', 200", 300 and 300') are installed.

The probe card assembly 702 can include a support structure 724 and a plurality of probes coupled to the support structure 716. For example, the support structure 724 can include one or more substrates providing electrical connections to the probes and to a tester. For example, substrates can include probe support substrates, interposers, space transformers, printed circuit boards, connectors, and similar components. Probes 716 can include spring contact elements, bumps on a compliant membrane, needle probes, and similar components used to make contact to the device under test 722.

The device under test 722 can be a die or multiple dies under test. Dies can be unsingulated dies on a wafer, singulated dies held in a carrier, and similar arrangements. Various arrangements of probes and support structures are known, and need not be described further. Components of the probe card assembly (e.g., regulators 102 and programmable controller 106) can be mounted on the support structure 724 using known techniques.

The test system can include a chuck 720 on which a device under test 722 is positioned. The probe card assembly 702 can be brought into contact with the device under test 722 by raising the chuck so that the probes 716 contact corresponding contacts 726 on the device under test 722. The chuck may also be moveable in other directions (e.g., "x," "y," and/or "z" directions).

The probe card assembly 702 communicates test signals between the test head 704 and the device under test 722 via the internal traces 712 and the probes 716. The probe card assembly can also supply power to the device under test 722, for example, regulating bulk power and distributing the regulated power to appropriate ones of the probes 716 as described above using the traces 712 and internal circuitry 714.

Figure 8:
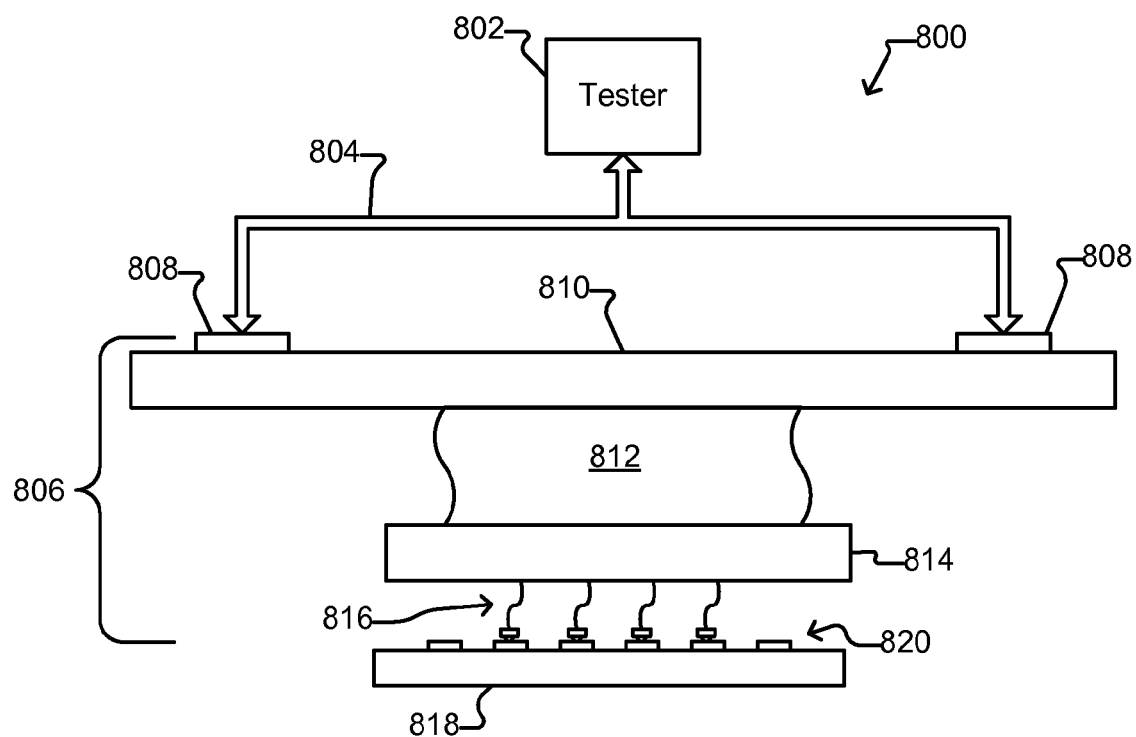
FIG. 8 illustrates a test system in which a probe card assembly can be used in accordance with some embodiments of the invention.

Further details of some embodiments of a probe card assembly are illustrated in FIG. 8 which illustrates a test system 800 that includes a probe card assembly 806. As shown in FIG. 8, the probe card assembly 806 can comprise a wiring substrate 810 (e.g., a semi-rigid substrate such as a printed circuit board or a rigid substrate such as a multi-layer ceramic substrate), a probe head 814, and flexible electrical connections 812 that provide electrical connections (not shown) between the wiring substrate 810 and the probe head 814. The wiring substrate 810, flexible electrical connections 812, and probe head 814 can be held together by any suitable means (not shown) including without limitation brackets, bolts, screws, etc. The wiring substrate 810 can include electrical connectors 808 (which can be non-limiting examples of an electrical interface to a test controller) configured to make electrical connections with a plurality of communications channels 804 to and from a tester 802 (which can be a non-limiting example of a test controller). The tester 802 can be a computer, computer system, or other processing device or devices configured to control testing of a DUT 818. The acronym "DUT" can mean "device under test," which can be any electronic device including without limitation semiconductor dies (singulated or in wafer form, packaged or unpackaged). Connectors 808 can be pads for receiving pogo pins, zero-insertion-force connectors, or any other electrical connection device suitable for making electrical connections with communications channels 804.

Electrically conductive paths (not shown) can be provided through the probe card assembly 806 to provide electrical connections from individual electrical connections in connectors 808 corresponding to one of the communications channels 804 to electrically conductive probes 816 on probe head 814. The probes 816 can be disposed to contact input and/or output terminals 820 of an electronic device under test ("DUT") 818. Those conductive paths (not shown) through the probe card assembly 806 can comprise electrically conductive connections, such as traces and/or vias (not shown), from the connectors 808 through the wiring substrate 810 to flexible electrical connections 812 to electrically conductive connections (not shown), such as traces and vias (not shown), through the probe head 814 to the probes 816. In this way, a plurality of signal paths comprising the communications channels 804, the above-described conductive paths (not shown) through the probe card assembly 806, and the probes 816 can be provided between the tester 802 and the input and/or output terminals 820 of the DUT 818.

The flexible electrical connections 812 can be implemented with any apparatus that can provide flexible or compliant electrical connections between the wiring substrate 810 and the probe head 814. For example, the flexible electrical connections 812 can comprise an interposer structure (not shown) comprising an interposer substrate and a first plurality of electrically conductive springs that extend from one surface of the substrate to make electrical connections with the wiring substrate 810 and a second plurality of electrically conductive springs that extend from another surface of the interposer substrate to make electrical connections with the probe head 814. The first conductive springs (not shown) and the second springs (not shown) can be electrically connected through the interposer substrate (not shown). In other examples, flexible electrical connections 812 can be simple wires electrically connecting the wiring substrate 810 and the probe head 814. In still other examples, the flexible electrical connections 812 can be replaced with rigid, inflexible electrical connections electrically connecting the wiring substrate 810 and the probe head 814.

The probe card assembly 806 can include circuitry on either the wiring substrate 810 and the probe head 814. The circuitry can be circuitry described above in conjunction with FIGS. 1-3 and 10-12. For example, the circuitry can be like circuitry 100, 200, 200', 200", 300, and 300'.

The configuration of probe card assembly 806 shown in FIG. 8 is an example only and is simplified for ease of illustration and discussion. Many variations, modifications, and additions are possible. For example, in some embodiments, the flexible electrical connections 812 need not be included, and the probe head 814 can be attached and electrically connected directly to the wiring substrate 810. As another example of a possible modification of the probe card assembly 806, the probe card assembly 806 can have more than one probe head 818, and each such probe head 818 can be independently adjustable. Non-limiting examples of probe card assemblies with multiple probe heads, like probe head 818, are disclosed in U.S. Patent Application Publication No. 2006/0290367. Additional non-limiting examples of probe card assemblies are illustrated in U.S. Pat. No. 5,974,662 and U.S. Pat. No. 6,509,751, and the aforementioned U.S. Patent Application Publication No. 2006/0290367, and various features of the probe card assemblies described in those patents and application can be implemented in the probe card assembly 806 show in FIG. 8.

DUT 818 can be tested as follows. The tester 802 can generate test signals, which can be provided through the communications channels 804, the probe card assembly 806, and one or more of the probes 816 to input terminals 820 of the DUT 818. Response signals generated by the DUT 818 can be sensed by probes 816 in contact with output terminals 820 of the DUT 818 and provided through the probe card assembly 806 and communications channels 804 to the tester 802. The tester 802 can analyze the response signals to determine whether the DUT 818 responded properly to the test signals and, consequently, whether the DUT 818 passes or fails the testing. The tester 802 can alternatively or in addition rate the performance of the DUT 818.

Figure 7:
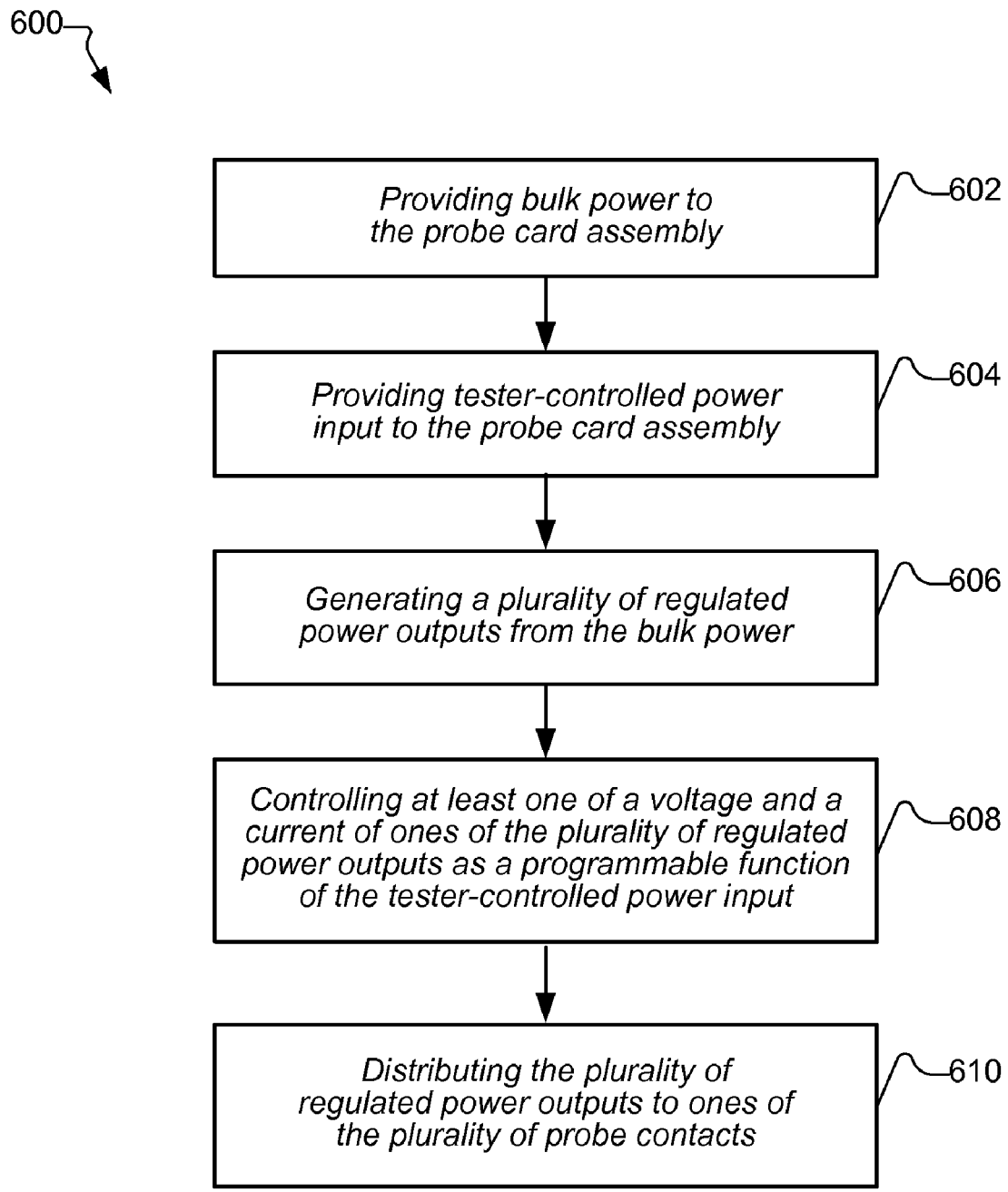
FIG. 7 is a flow chart of a method of distributing power to a plurality of dies using a probe card assembly in accordance with some embodiments of the present invention.

FIG. 7 illustrates a flow chart of a process 600 for distributing power to one or more power inputs to one or more dies on a wafer. The process can be practiced, for example, using a probe card assembly like 702 and 806 installed in a tester, for example, as illustrated in FIGS. 6 and 8. The probe card assembly can include probe card circuitry like 100, 200, 200', 200", 300, 300' of FIGS. 1-3 and 11-12. The probe card can include probe contacts for making temporary pressure electrical connections to terminals on the plurality of dies for input and output of electrical signals. The process can include accepting bulk power input to the probe card assembly 602. Bulk power can be accepting from any of a number of input sources, including for example, unregulated power from the tester to the probe card (e.g., using test head power as described above), power from an auxiliary power supply separate from the tester (e.g., as described above), and power from a tester power channel (e.g., a tester channel typically used to provide power and designed or programmed to supply power to a device under test). When accepting power from a tester power channel, the tester power channel can be set to a voltage selected to maximize power output, for example as described above, or other voltages. The resulting voltage can then be converted on the probe card to provide desired voltage levels for the plurality of dies (e.g., as discussed above).

The process 600 can also include accepting a tester-controlled power input to the probe card 604 and generating a plurality of regulated power outputs from the bulk power 606. For example, the tester-controlled power input can be a power channel, for example, a channel typically used to provide power. The power channel can be used for control, and thus need not be capable of supplying the full power requirements for the plurality of dies, as the power to the dies can be provided from the bulk power. For example, regulators or DC-DC converters, as described above, can be used to generate regulated power form the bulk power. One, two, or more regulated power outputs can be provided.

Another operation of the process 600 can be controlling at least one of a voltage and a current of ones of the plurality of regulated power outputs as a programmable function of the tester-controlled power input 608. In other words, one or more of the regulated power outputs can be set equal to the programmable function of the tester-controlled power input.

For example, regulators or DC-DC converters can be controlled by a programmable controller as described above. The tester-controlled power input can be digitally sampled (e.g., using an analog to digital converter as described above) to form a sampled value. A mathematical operation can be performed on the sampled value to obtain a second value (e.g., using a microcontroller as described above). The second value can be used to set the voltage or current of the regulated outputs (e.g., using a programmable power supply as described above).

Control of the voltage and current can be various functions of the tester-controlled power input, for example, as described above. For example, the voltage can be set equal to the tester-controlled power input to cause the regulated power outputs to track the tester-controlled power input. As another example, the voltage can be set to track the tester-controlled power input with an offset. As yet another example, the voltage can be set to a ramp in response to a step change in the tester-controlled power input. In general, the function can be a mathematical function, such as a linear function (e.g., addition, subtraction, multiplication, division, and combinations thereof) or non-linear function.

Control of the regulated power outputs can be performed before, during, and after a test cycle. For example, before a test cycle, voltages can be ramped up according to a predefined sequence. Predefined sequences can include, for example, ramping some regulated output voltages up before other regulated output voltages, or ensuring that some voltages are always at higher levels than other voltages.

Control of the voltage and current can be performed during a test cycle, and if desired, coordinated with the test cycle using additional tester channel(s). For example, during a first portion of a test cycle, the voltage (and/or current) of the regulated outputs can be set to a first value, and during a second portion of a test cycle, the voltage (and/or current) of the regulated outputs can be set to a second value. The additional tester channel(s) can be used to designate the boundary between the first portion of the test cycle and the second portion of the test cycle.

Different regulated outputs can be controlled according to different functions. For example, first ones of the regulated power outputs can be controlled according to a first function of the tester-controlled power input and second ones of the regulated power outputs can be controlled according to second function of the tester-controlled power input.

The process 600 can also include distributing the plurality of regulated power outputs to ones of the plurality of probe contacts 610. For example, wiring within the probe card can distribute the regulated power to the probe contacts. It will be appreciated that ones of the probe contacts can be used for supplying power, while other ones of the probe contacts can be used for test signals. Accordingly, any one of the plurality of regulated power outputs can be provided to one, two, or more of the probe contacts. Further, it will be appreciated that different regulated power outputs can be provided to the same probe contact(s) when regulated power outputs are ganged together.

Although specific embodiments and applications of the invention have been described in this specification, these embodiments and applications are exemplary only, and many variations are possible.

I claim:

1. A probe card assembly comprising:
   a support structure comprising a plurality of probes;
   an electrical interface to a tester comprising a tester-controlled power input to the probe card assembly;
   a bulk power input to the probe card assembly;
   a plurality of regulators, each regulator comprising an input coupled to the bulk power input, a regulated output electrically connected to ones of the plurality of probes, and a control input configured to control at least one of a voltage and a current of the regulated output; and
   a programmable controller coupled to the control inputs of ones of the plurality of regulators and to the tester-controlled power input and configured to adjust the control inputs as a function of the tester-controlled power input.

2. The probe card assembly of claim 1, wherein the bulk power input is part of the electrical interface to the tester.

3. The probe card assembly of claim 2, wherein the bulk power input is coupled to a tester output channel wherein the tester output channel is programmed for maximized power output from the tester.

4. The probe card assembly of claim 1, wherein the bulk power input is part of a second electrical interface different from the electrical interface to the tester.

5. The probe card assembly of claim 1, wherein ones of the plurality of regulators comprise a switching power supply.

6. The probe card assembly of claim 1, wherein the programmable controller comprises an analog to digital converter coupled to the tester-controlled power input and configured to digitally sample the tester-controlled power input to form a sampled value.

7. The probe card assembly of claim 6, wherein the programmable controller comprises a microcontroller coupled to the digital to analog converter and configured to accept the sampled value and calculate the control input using the control value.

8. The probe card assembly of claim 1, wherein the programmable controller comprises a control interface to the tester.

9. The probe card assembly of claim 1, wherein the programmable controller comprises a means for performing a mathematical operation.

10. The probe card assembly of claim 1, wherein the programmable controller comprises a state machine.

11. The probe card assembly of claim 1, wherein ones of the plurality of regulators comprise a sense input and are further configured to control the at least one of the voltage and the current in proportion to at least one of a voltage and a current at the sense input.

12. The probe card assembly of claim 1, wherein ones of the plurality of regulators comprise a limit input and are further configured to limit at least one of the voltage and the current to a value determined by the limit input.

13. A probe card assembly comprising:
    a plurality of probes;
    means for accepting bulk input power;
    means for accepting a tester-controlled power input;
    means for generating a plurality of regulated power outputs from the bulk power input;
    means for controlling at least one of a voltage and a current of ones of the regulated power outputs as a function of the tester-controlled power input; and
    means for distributing the plurality of regulated power outputs to ones of the plurality of probes.

14. The probe card assembly of claim 13, wherein the means for controlling at least one of a voltage and a current comprises means for performing mathematical calculations.

15. The probe card assembly of claim 14, wherein the means for performing mathematical calculations comprises means for performing any of adding a selectable offset, subtracting a selectable offset, averaging, and combinations thereof.

16. The probe card assembly of claim 14, wherein the means for performing mathematical calculations comprising means for performing a nonlinear function.

17. The probe card assembly of claim 13, wherein the means for controlling at least one of a voltage and a current comprises means for varying the at least one of a voltage and a current during a test cycle.

18. A method of distributing power to a plurality of dies via probe contacts of a probe card assembly installed in a tester, the method comprising:
   accepting bulk power input to the probe card assembly;
   accepting a tester-controlled power input to the probe card assembly;
   generating a plurality of regulated power outputs from the bulk power;
   controlling at least one of a voltage and a current of ones of the plurality of regulated power outputs as a programmable function of the tester-controlled power input; and
   distributing the plurality of regulated power outputs to ones of the plurality of probe contacts.

19. The method of claim 18, wherein the accepting bulk power input comprises accepting unregulated power from the tester to the probe card.

20. The method of claim 18, wherein the accepting bulk power input comprises accepting power from an auxiliary power supply separate from the tester.

21. The method of claim 18, wherein the accepting bulk power comprises accepting power from a second tester-controlled power input, wherein the second tester-controlled power input is set to a voltage selected for maximized power output from the tester independent of a voltage of the regulated power outputs.

22. The method of claim 18, wherein the controlling at least one of a voltage and a current comprises setting the voltage equal to a voltage of the tester-controlled power input.

23. The method of claim 18, wherein the controlling at least one of a voltage and a current comprises generating a ramp in response to a step change in the test-controlled power input.

24. The method of claim 18, wherein the controlling at least one of a voltage and a current of the regulated power outputs comprises
   digitally sampling the tester-controlled power input to form a sampled value;
   performing a mathematical operation on the sampled value to obtain a second value; and
   setting at least one of the voltage and the current of the regulated power outputs equal to the second value.

25. The method of claim 24, wherein the mathematical operation is a linear function of the tester-controlled power input.

26. The method of claim 24, wherein the mathematical operation is a non-linear function of the tester-controlled power input.

27. The method of claim 18, further comprising:
   setting the at least one of the voltage and the current of ones of the regulated power outputs equal to a first value during a first portion of a test cycle; and
   setting the at least one of the voltage and the current of the same ones of the regulated power outputs equal to a second value during a second portion of the test cycle.

28. The method of claim 18, wherein the controlling at least one of a voltage and a current of the regulated power outputs comprises:
   controlling first ones of the regulated power outputs according to a first function of the tester-controlled power input; and
   controlling second ones of the regulated power outputs according to a second function of the tester-controlled power input, the second function being different from the first function.

29. The method of claim 18, wherein the controlling at least one of a voltage and a current of the regulated power outputs comprises ramping the at least one of the voltage and the current according to a predefined power on sequence.

* * * * *